(12) United States Patent
Tsutsui et al.

(10) Patent No.: US 6,197,609 B1
(45) Date of Patent: Mar. 6, 2001

(54) METHOD FOR MANUFACTURING SEMICONDUCTOR LIGHT EMITTING DEVICE

(75) Inventors: Tsuyoshi Tsutsui; Masayuki Sonobe; Norikazu Ito, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/391,625

(22) Filed: Sep. 7, 1999

(30) Foreign Application Priority Data

Sep. 7, 1998 (JP) .................................................. 10-252519

(51) Int. Cl.[7] .................................................. H01L 21/00
(52) U.S. Cl. .................................................. 438/33
(58) Field of Search .................................. 438/22, 26, 33, 438/38, 42, 46, 460, 462, 465

(56) References Cited

U.S. PATENT DOCUMENTS 5,629,233 * 5/1997 Chand et al. ........................... 438/33
5,780,320 * 7/1998 Kinoshita ................................ 438/33

* cited by examiner

Primary Examiner—Charles Bowers
Assistant Examiner—Keith Christianson
(74) Attorney, Agent, or Firm—Arent Fox Kintner Plotkin & Kahn, PLLC

(57) ABSTRACT

Semiconductor layers forming a light emitting layer and including an n-type layer and p-type layer are formed onto a substrate, then the n-type layer is exposed by removing a part of the laminated semiconductor layers. p-side electrode and n-side electrode are then respectively formed on the p-type layer on the surface of the laminated semiconductor layers and the exposed n-type layer, respectively in an electrically connected manner, followed by dicing of the substrate from the exposed n-type layer to the substrate at portions at which breaking of the substrate is performed. Then a protection film is provided on the entire surface of the laminated semiconductor layers as to expose the p-side and n-side electrodes, and breaking of the substrate is performed at dicing portions into individual chips. Consequently, semiconductor light emitting devices can be obtained by breaking the wafer into individual chips without etching the protection film and without damaging the protection film at the time of breaking. Also, the light emitting devices can be improved.

5 Claims, 3 Drawing Sheets

METHOD FOR MANUFACTURING SEMICONDUCTOR LIGHT EMITTING DEVICE

FIELD OF THE INVENTION

The present invention relates to a method for manufacturing semiconductor light emitting devices wherein a light emitting chip is formed by first laminating semiconductor layers including a p-type layer and an n-type layer onto a wafer form substrate and breaking the wafer into individual chips thereafter. More particularly, the present invention relates to a method for manufacturing semiconductor light emitting divice such as blue to yellow semiconductor light emitting devices obtained by laminating gallium nitride based compound semiconductor onto a sapphire substrate, wherein breaking of the wafer into individual chips is performed by dicing a semiconductor layer side, and the number of processes to be performed can be decreased and losses of the wafer can be decreased.

BACKGROUND OF THE INVENTION

Chips of semiconductor light emitting devices (hereinafter referred to as "LED chips") that generate blue to yellow light of high luminance are conventionally manufactured in the following manner. As shown in FIG. 3, there are sequentially formed, through epitaxial growth onto a sapphire substrate 21, an n-type layer (cladding layer) 23 of e.g. n-type GaN, an active layer (light emitting layer) 24 of e.g. InGaN based compound semiconductor (wherein the ratio of In and Ga may be varied as it similarly applies hereinafter) which is a material whose band gap energy is smaller than that of the cladding layer and which determines the light emitting wavelength, and a p-type layer (cladding layer) 25 of p-type GaN. A p-side electrode 28 is formed onto a surface of the laminated semiconductor layers with a current diffusion layer 27 interposed between, and a part of the laminated semiconductor layers is etched so that an n-side electrode 29 is formed on the exposed surface of the n-type layer 23. A protecting film 30 of e.g. SiO$_2$ is further provided on the surface such that the electrodes 28, 29 are exposed therefrom, and dicing is performed to obtain a dicing groove 31 having a depth of approximately several tens of μm. After grinding a rear surface of the substrate 21 for thinning the wafer from approximately 350 μm to assume a thickness of approximately 100 μm, a scribe line 21a is formed from the rear surface of the substrate 21 at boundary line S of the chips by using a diamond cutter or the like, and by applying force to the portion of the scribe line 21a, breaking is performed to divide the wafer into individual chips.

Since a sapphire substrate is extremely hard, the depth of the scribe line 21a will be a shallow cut of not more than several μm. It should be noted that an AlGaN based (wherein the ratio of Al and Ga may be varied as it similarly applies hereinafter) compound semiconductor layer may be used on the side of the active layer 23 since n-type layer 23 and p-type layer 25 function to improve confinement effect of carriers. Further, when performing etching of the above-described semiconductor layers to be laminated, portions to be broken are simultaneously etched at the boundary lines S of individual chip to expose the n-type layer 23 whereby easy breaking is made possible.

In case dividing is performed through dicing after a protection film is provided on the surface side of the semiconductor layers in the above-described manner, the protection film 30 may cause chipping at the time of performing dicing such that cracks directed to various directions may be formed on the protection layer 30 by an edge of a dicer so that the yield factor is degraded. In order to solve this problem, it is generally performed that dicing is performed after removing the protection film 30 of portions to be diced, as shown in the sectional view and the plan view of FIG. 3 and FIG. 4, respectively. In this case, width A for removing the protection layer is required to be approximately 60 μm in view of the fact that width W of the dicing groove 31 is approximately 20 μ m, that distance B between the dicing groove 31 and the protection film 30 is at least required to be approximately 15 μm in view of reliability, and that a positional shift of the dicing groove 31 be approximately 5 μm.

As explained above, in case dicing is performed after forming a protection film on a surface side of the semiconductor layers, it is presented a drawback that the protection film be damaged to be inferior in reliability and that the yield factor be degraded in case dicing is performed without removing the protection film. On the other hand, in case removal of the protection film at portions to be diced is preliminarily performed, it is required to secure two margins, one for the pattern shift at the time of etching the protection film and the positional shift at the time of dicing, so that intervals between chips need to be kept wider. This will result in a fewer number of chips to be obtained from a wafer though the sizes of the wafers may be identical, and will cause a drawback in that the costs become higher.

SUMMARY OF THE INVENTION

The present invention has been made for solving such problems, and it is a purpose of the present invention to provide a method for manufacturing semiconductor light emitting device wherein breaking (dividing) from a wafer into individual chips through dicing can be performed without etching the protection film and without damaging the protection film.

The manufacturing method for semiconductor light emitting device according to the present invention comprises the steps of (a) laminating semiconductor layers onto a wafer form substrate which forms a light emitting layer and which includes a first conductivity type semiconductor layer and a second conductivity type semiconductor layer, (b) exposing the second conductivity type semiconductor layer by removing a portion of the laminated semiconductor layers, (c) forming first and second electrodes on the first conductivity type semiconductor layer that is the surface of the laminated semiconductor layers and on the second conductivity type semiconductor layer that is exposed by removing a part of the laminated semiconductor layers, respectively in an electrically connected manner, (d) dicing the wafer form substrate with the laminated semiconductor layers at portions to be broken into individual chips extending from a side of the second conductivity type semiconductor layer that is exposed by removing, as to reach the substrate, (e) providing a protection film on the entire surface of the laminated semiconductor layers in a manner that the first and second electrodes are exposed, and (f) breaking the wafer form substrate into individual chips by performing dividing at the portions of dicing.

Here, the term "dicing" means to form a cutting groove to assume a certain depth by using a dicer or the like, and "breaking" means to divide the wafer into individual chips by splitting (fracturing) or cutting.

In the above method, the protection film is provided after forming grooves through dicing so that it is not necessary to remove the protection film of the breaking portions through etching, and it will moreover be prevented that the protection film be damaged at the time of performing dicing. Further, no margin for alignment at the time of etching the protection film will be required so that the number of chips to be obtained from a single wafer will be increased.

In case the substrate is made of a sapphire and the laminated semiconductor layers a gallium nitride based compound semiconductor, especially large effects may be achieved since the chip of light emitting device may be easily obtained wherein semiconductor layers are laminated on a sapphire substrate which is generally hard to be broken.

Here, a "gallium nitride based compound semiconductor" refers a semiconductor comprising a compound having Ga of III group elements and N of V group elements wherein a part or all of the Ga of III group elements may be substituted by other III group elements such as Al or In and/or a part of N of the V group elements may be substituted by other V group elements such as P or As.

DETAILED DESCRIPTION

Figure 1:
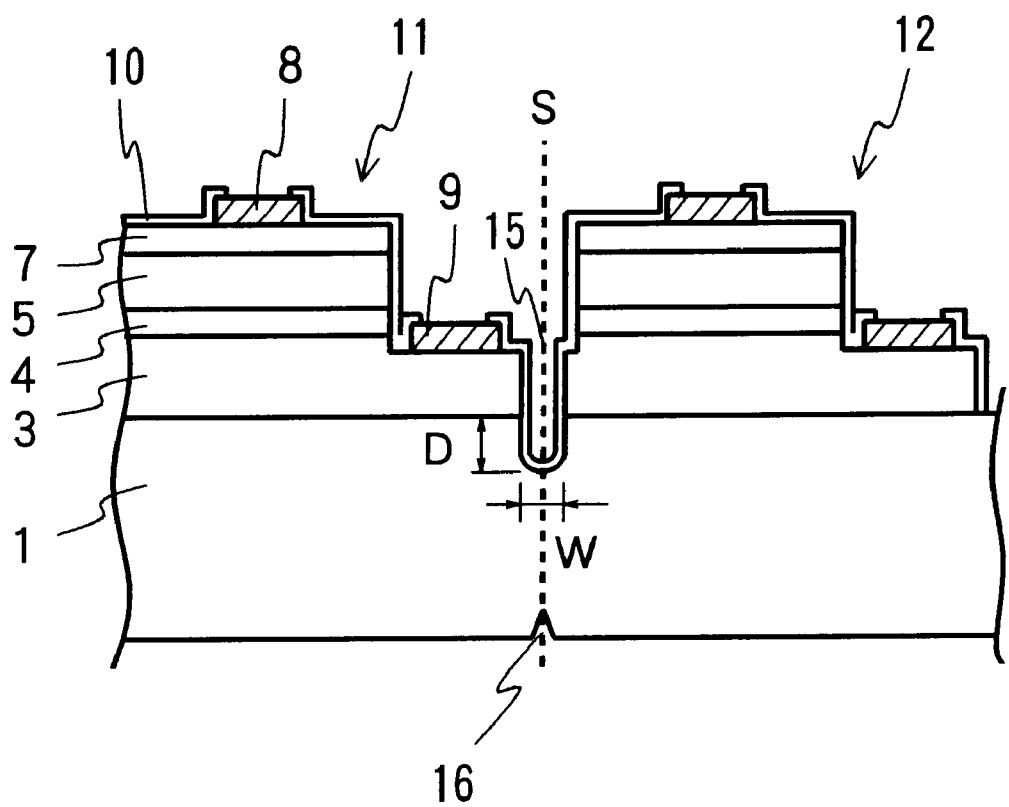
FIG. 1 sectional explanatory view showing a feature before breaking according to one embodiment of the manufacturing method of the present invention.
Figure 2A:
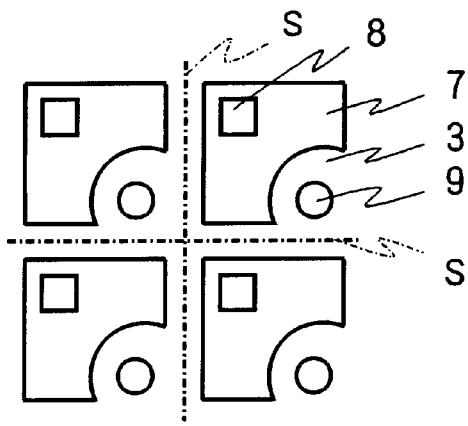
FIG. 2 (a) to 2 (c) are plan explanatory views showing dicing processes and protection film forming processes according to the manufacturing method of FIG. 1.

FIG. 1 is a partial sectional explanatory view showing a feature before breaking according to one embodiment of the manufacturing method of the present invention, in which gallium nitride based compound semiconductor layers, which are suitable for generating blue to yellow light of high luminance, are laminated onto a wafer form sapphire substrate, and FIG. 2 is a plan explanatory view showing processes performed before dicing up to forming a protection film.

(a) As shown in FIG. 1, semiconductor layers including a first conductivity type semiconductor layer (p-type layer 5) and a second conductivity type semiconductor layer (n-type layer 3) for forming a light emitting layer are first laminated onto a wafer form substrate 1.

More detailed explanations will follow. For laminating semiconductor layers through e.g. metal organic chemical vapor deposition method (MOCVD method), reactive gas and required dopant gas is introduced, and there are respectively formed onto a substrate 1 of e.g. sapphire ($Al_2O_3$ single crystal) a low temperature buffer layer of GaN (not shown), an n-type layer 3 which is the cladding layer including an n-type GaN and/or AlGaN based compound semiconductor with a layer thickness of approximately 1 to 5 $\mu$m, an active layer 4 which may be an InGaN based compound semiconductor layer or any material which bandgap energy will be smaller than that of the cladding layer with a layer thickness of approximately 0.05 to 0.3 $\mu$m, and a p-type layer (cladding layer) 5 of p-type AlGaN based compound semiconductor layer and/or GaN layer a layer thickness of approximately 0.2 to 1 $\mu$m. It should be noted that annealing processes of the p-type layer 5 may be performed after lamination for activating the same. Thereafter, Ni and Au are evaporated and sintered to form a current diffusion layer 7 which may be e.g. a metal layer with a layer thickness of 2 to 100 nm.

(b) Then, the n-type layer 3 is exposed by removing a portion of the laminated semiconductor layers for forming an n-side electrode 9. That is, the mask is formed by providing and patterning a resist film onto the surface of the laminated semiconductor layers, and by performing etching of a part of the current diffusion layer 7 and the laminated semiconductor layers 3 to 5, the n-type layer 3 is exposed. At this time, the n-type layer 3 of the periphery of boundary portion S is exposed by also etching portions of the laminated semiconductor layers in the periphery of boundary portion S at which dividing into individual chips is performed. This etching may be performed through reactive ion etching using e.g. chloride gas, and in case of etching semiconductor layers having a large thickness, etching can be performed by using e.g. Ti as a mask.

(c) Next, first (p-side) and second (n-side) electrodes 8, 9 are formed on the p-type layer 5 (current diffusion layer 7) on the surface of the laminated semiconductor layers and on the exposed n-type layer 3 that is exposed by removing a part of the semiconductor layers, respectively in an electrically connected manner.

The p-side electrode 8 and n-side electrode 9 are respectively formed in that Ti and Al are respectively deposited through vacuum evaporation with a thickness of approximately 0.1 $\mu$m and 0.3 $\mu$m, respectively, and sintered thereafter to obtain the n-side electrode 9, and in that Ti and Al are respectively laminated through vacuum evaporation to obtain the p-side electrode 8. As explained above, in case the current diffusion layer 7 is provided, the p-side electrode 8 is electrically connected to the p-type layer 5 via the current diffusion layer 7, and in case no diffusion layer 7 is provided, the p-side electrode 8 is electrically connected to the p-type layer 5 either in a direct manner or via another p-type semiconductor layer. A plan view of this feature is shown as FIG. 2(a).

Figure 2B:
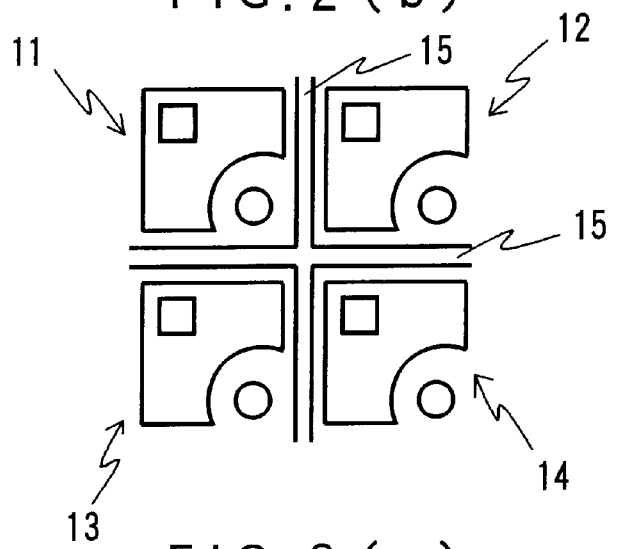

(d) Then, the semiconductor layer laminated on the wafer form substrate 1 is diced from the side of the exposed surface of the laminated semiconductor layers up to the substrate 1 at portions of vertical and lateral boundary portions S at which breaking into individual chips 11 to 14 is performed, as shown in FIG. 2(b).

The dicing is performed for enabling easy breaking at the boundary portions S for breaking the sapphire substrate 1, and while it is essentially preferable that depth D of dicing groove 15 on the substrate 1 be as deep as possible, the sapphire substrate 1 being extremely hard and hard to be cut and the dicer being easily damaged, the depth is formed to be as shallow as possible just enough to function as guide grooves at the time of breaking. More particularly, depth D from the surface of the substrate 1 is preferably set to approximately several tens of $\mu$m, and more preferably, approximately 20 to 30 $\mu$m. It should be noted that width W of the dicing groove 15 is formed to be approximately 20 $\mu$m as described above.

Figure 2C:
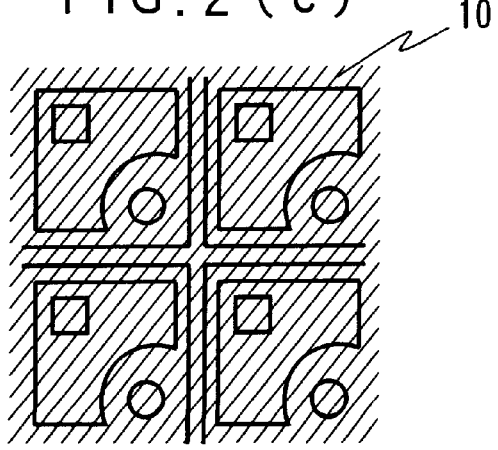
Figure 3:
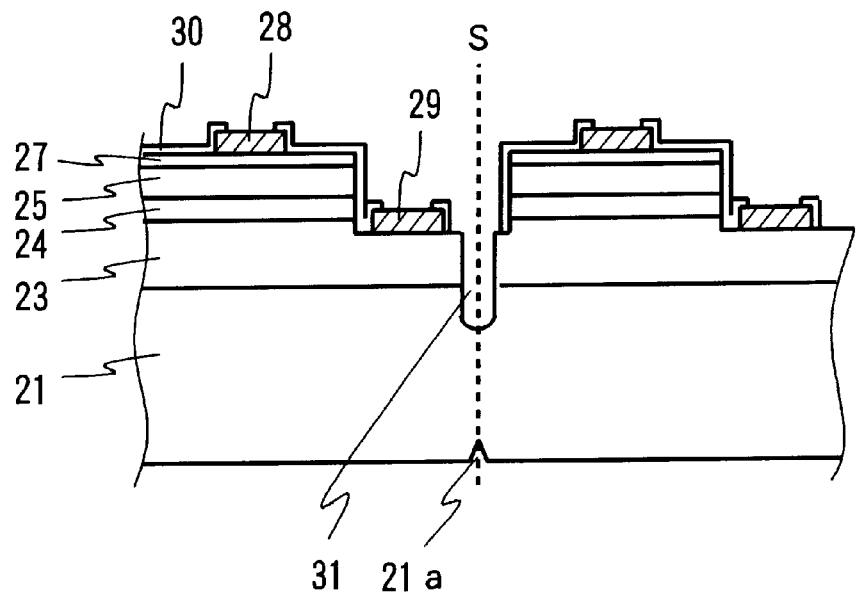
FIG. 3 is a sectional explanatory view for explaining conventional manufacturing method.
Figure 4:
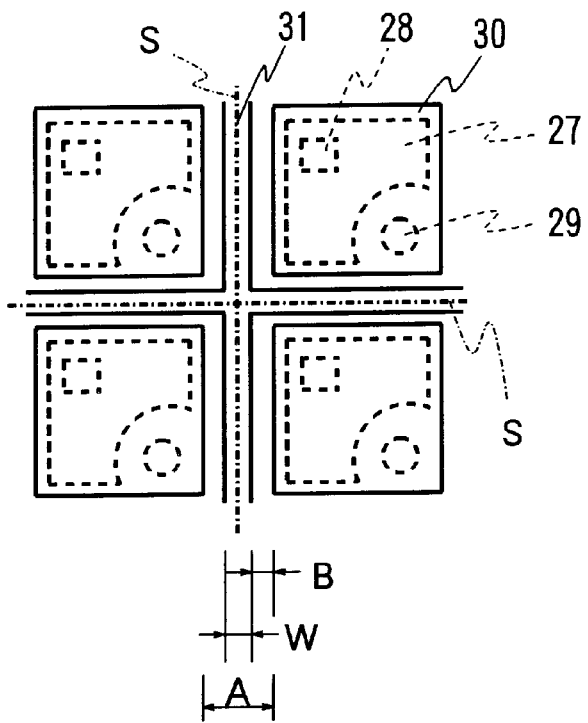
FIG. 4 is a plan explanatory view for explaining a conventional manufacturing method for semiconductor light emitting device.

(e) Next, a protection film 10 is formed on the overall surface as shown in FIG. 2(c), and thereafter, exposing of the p-side electrode 8 and n-side electrode 9 is performed as shown in FIG. 1. That is, the protection film 10 is formed on the exposed surface of the laminated semiconductor layers such that the p-side electrode 8 and n-side electrode 9 are exposed. More particularly, a $SiN_x$ film or $SiO_y$ film is provided with a thickness of 500 to 5,000 Å through e.g. CVD method. Exposing the electrodes 8, 9 can be performed by leaving the protection film 10 at peripheral portions thereof and removing the inside protection film above the electrodes as shown in FIG. 1. Removing the protection film 10 above the electrodes 8, 9 can be performed through methods such as lift off method wherein a resist film is formed on corresponding portions before depositing the protecting film and removing the resist film after dipositing a protecting film on the overall surface, or by etching through photolithography processes after depositing an overall film.

(f) Then, the wafer form substrate 1 is separated into individual chips by dividing it at dicing portions (boundary portions S) as shown in FIG. 1.

More particularly, the rear surface of the substrate 1 is ground by using a lapping device for thinning the substrate 1 from 350 µm to a thickness of approximately 100 to 150 µm, and linear scribe lines 16 is formed into the boundary portion S on the rear surface of the substrate 1 by using a diamond cutter. Thereafter, by applying momentary shock to a portion of the scribe line 16, the wafer form substrate 1 is divided into individual chips 11, 12.

According to the present invention, since after dicing grooves are formed at portions to be broken a wafer into individual chips, a protection film is provided on the overall surface thereof, the protection film can be prevented from chipping at the time of performing dicing. So it can be performed at a high yield factor in manufacturing process. Moreover, since it is not necessary to preliminarily perform etching of the protection film, corresponding alignment margins can be eliminated so that the interval between chips can be limited to be minimum, corresponding to only the width of the dicing groove and positioning shift margin at the time of performing dicing, so that the number of chips to be obtained from a single wafer can be improved. Still further, since the protection film will also adhere within the dicing groove, all of the sidewalls of the semiconductor layers will be covered by the protection film so that the reliability will be extremely improved.

On the other hand, since all processes from electrode forming up to dicing are successively performed and since the protection film can be formed after sufficiently cleaning and purifying the surface after dicing, there are no factors through which any characteristics may be degraded regardless to the absence of a protection film formed before dicing. Further, although dicing is performed before forming the protection film, the depth of the dicing grooves will only be in the range of several tens of µm up to not more than 100 µm while the sapphire substrate 1 has a thickness of approximately 300 to 350 µm, mechanical strengths at the time of treatments such as protection film forming process will in no case be affected.

According to the present invention, costs may be remarkably decreased since the yield factor will not be degraded due to damages of the protection film and since it is not necessary to remove the protection film of portions for dicing by preliminarily etching the protection film. Further, since no alignment margins are required for etching, the interval between chips can be narrowed, whereby the number of chips to be obtained from a single wafer can be improved so that this contributes to a further decrease in costs. Moreover, since the semiconductor layer is tightly covered by the protection film, no variations in characteristics are caused and the reliability can be extremely improved. Consequently, it can be obtained for semiconductor light emitting device which are of low cost and which present favorable characteristics.

Although preferred example have been described in some detail, it is to be understood that certain changes can be made by those skilled in the art without departing from the spirit and scope of the invention as defined by the appended claims.

What is claimed is:

1. A manufacturing method for semiconductor light emitting device, comprising the steps of:

(a) laminating onto a wafer form substrate semiconductor layers which includes a first conductivity type semiconductor layer and a second conductivity type semiconductor layer, and which forms a light emitting layer;

(b) exposing said second conductivity type semiconductor layer by removing a portion of the laminated semiconductor layers;

(c) forming first and second electrodes on said first conductivity type semiconductor layer of a surface of said laminated semiconductor layers and on said second conductivity type semiconductor layer that is exposed by removing said portion of said laminated semiconductor layers, respectively in an electrically connected manner;

(d) dicing said substrate with said laminated semiconductor layers at portions to be broken between individual chips extending from a side of said second conductivity type semiconductor layer that is exposed by removing as to reach the substrate;

(e) providing a protection film on an overall surface of said laminated semiconductor layers in a manner that said first and second electrodes are exposed; and (f) breaking said substrate into individual chips by performing dividing at said portions of dicing.

2. The manufacturing method of claim 1, wherein said substrate is made of a sapphire and said laminated semiconductor layers are made of a gallium nitride based compound semiconductor.

3. The manufacturing method of claim 1, wherein said protection film is a $SiN_x$ film or $SiO_y$ film having a thickness of 500 to 5,000 Å.

4. The manufacturing method of claim 1, wherein a linear scribe line is formed at portions to be broken between individual chips on a rear surface of said substrate, and said substrate is divided into individual chips by applying momentary shock to said portions of said scribe line.

5. The manufacturing method of claim 1, wherein said protection layer is formed after purifying the surface of said laminated semiconductor layer by cleaning after said dicing.

* * * * *